(12) United States Patent
Agahi-Kesheh

(10) Patent No.: US 6,430,402 B1
(45) Date of Patent: Aug. 6, 2002

(54) POWER AMPLIFIER SATURATION PREVENTION METHOD, APPARATUS, AND COMMUNICATION SYSTEM INCORPORATING THE SAME

(75) Inventor: Darioush Agahi-Kesheh, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/152,439

(22) Filed: Sep. 14, 1998

(51) Int. Cl.[7] .......................... H03C 1/62; H01Q 11/22; H03G 3/20
(52) U.S. Cl. .................. 455/115; 455/126; 455/522; 455/117; 455/127; 455/234.2; 330/129; 330/285
(58) Field of Search ................. 455/126, 522, 455/115, 117, 127, 234.2, 239.1, 240.1, 234.1, 232.1, 116; 330/129, 285, 278

(56) References Cited

U.S. PATENT DOCUMENTS

| | | | |
|---|---|---|---|
| 4,442,407 A | * 4/1984 | Apel ........................... 330/128 |
| 5,129,098 A | * 7/1992 | McGirr et al. ............... 455/127 |
| 5,132,634 A | * 7/1992 | Suarez ......................... 455/116 |
| 5,278,994 A | 1/1994 | Black et al. ................. 455/126 |
| 5,526,528 A | * 6/1996 | Kurisu ......................... 455/117 |
| 5,548,539 A | * 8/1996 | Vlach et al. ..................... 703/6 |
| 5,589,796 A | * 12/1996 | Alberth, Jr. et al. ......... 455/126 |
| 5,673,001 A | * 9/1997 | Kim et al. ................... 455/126 |
| 5,774,797 A | * 6/1998 | Kawano et al. ............. 455/127 |
| 5,828,953 A | * 10/1998 | Kawase ....................... 455/127 |
| 5,896,261 A | * 4/1999 | Black ............................. 361/92 |
| 6,011,323 A | * 1/2000 | Camp ........................... 455/117 |
| 6,020,787 A | * 2/2000 | Kim et al. ................... 455/126 |
| 6,047,168 A | * 4/2000 | Carlsson et al. ............ 455/127 |
| 6,070,058 A | * 5/2000 | Waldroup et al. ............. 455/69 |
| 6,081,161 A | * 6/2000 | Dacus et al. ................ 330/285 |
| 6,128,477 A | * 10/2000 | Freed .......................... 455/115 |

* cited by examiner

*Primary Examiner*—William Trost
*Assistant Examiner*—Rafael Perez-Gutierrez
(74) *Attorney, Agent, or Firm*—Foley & Lardner

(57) ABSTRACT

An apparatus for controlling the power level of an output signal from the output of an electronic amplifier. The electronic amplifier has a control signal input for receiving an amplifier control signal and has a power input for receiving current from a power supply. The apparatus comprises an amplifier output power detector, coupled to the output of the amplifier, used for generating a power measurement signal representing the output power of the amplifier. The apparatus contains a current detector arranged to detect the current received by the amplifier from the power supply and to provide a current measurement signal dependent on the amount of current received from the power supply. The apparatus contains a digital signal processor which receives the current measurement signal and provides a reference signal dependant on the current measurement signal. The apparatus also contains a comparator coupled to receive the reference signal and the power measurement signal which is used for generating the control signal to prevent saturation of the amplifier.

15 Claims, 4 Drawing Sheets

POWER AMPLIFIER SATURATION PREVENTION METHOD, APPARATUS, AND COMMUNICATION SYSTEM INCORPORATING THE SAME

FIELD OF THE INVENTION

This invention relates to power amplifier control circuits. More specifically, the invention relates to saturation detection and control for power amplifiers.

BACKGROUND OF THE INVENTION

The use of power amplifiers in transmitting radio frequency (RF) signals has many applications, including, but not limited to radiotelephone communications systems. A typical radiotelephone communications system includes multiple fixed site transceivers. Each fixed site transceiver is an interface between the line telephone system and multiple portable, or mobile radiotelephone units located within a geographic area served by the fixed site transceiver. The fixed site transceiver and the radiotelephones communicate by sending radio frequency (RF) signals to each other.

Radiotelephones are generally of two different types. Some conventional radiotelephone systems employ analog units that are basically the equivalent of a walkie-talkie. Each analog unit communicates voice messages by broadcasting a radio frequency (RF) carrier signal which has been modulated in some fashion by an analog signal corresponding to the voice message. Other radiotelephone systems employ a digital unit. Digital units convert the speech into a digital representation and then broadcast a radio frequency (RF) carrier modulated with the digital representation of the speech.

Analog radiotelephone systems typically employ a limited RF spectrum for radiotelephone communications. According to one conventional communication method, the RF spectrum is divided into relatively narrow segments of frequency. Upon request, each radiotelephone is allotted one of these dedicated segments in which to broadcast and receive signals from the fixed site transceiver. This method of communication is known as Frequency Division Multiple Access (FDMA). Using this method the radiotelephone transmitter would turn on and remain on the fixed frequency for the duration of the call. If the turn on functions and turn off of the transmitter are limited to the beginning and end of the phone call, the turn on and turn off function's timing requirements are not very stringent.

There are several difficulties with the described FDMA system however. One of the difficulties is that, in portable units, keeping the transmitter powered during the course of a telephone call can consume a significant amount of energy. Since operation time is limited by the amount of energy contained within the portable unit, it is typically desirable to minimize power consumption and thereby increase the portable unit's operating time.

Another problem with the analog version of the FDMA system is that, because it is an analog system, it is prone to the usual problems inherent in analog systems such as spurious signals, interferences from other sources of RF energy, multipath reception, and fade outs. The same types of problems will occur with digital systems, but because they are digital, error correction coding and a variety of other digital and software techniques help compensate for these difficulties. Digital systems can help to more efficiency use precious bandwidth providing more users than analog systems for a given level of quality. Accordingly, alternate methods of communication have been developed such as Time Division Multiple Access (TDMA). This method operates by sharing a single frequency band among users by dividing the band into time slots and allotting a time slot to each radiotelephone unit. Each radiotelephone unit then broadcasts data during its allotted time slot and stops transmission until the next time allotted time slot occurs, and then the radiotelephone unit broadcasts again. This method has advantages which address many of these aforementioned analog FDMA problems.

First, because the radiotelephone is actually broadcasting only during it's own time slot, there is a reduction in the power consumed because there is no need to keep the RF power amplifier of the transmitter on continuously during the call. In fact if the RF power amplifier of the transmitter did remain on during the entire call it may result in interference with other units using successive time slots. The RF power amplifier in a mobile radiotelephone usually requires a relatively large amount of energy and is therefore a significant contributor to battery drain. Because in TDMA systems the power amplifier of the transmitter is actually turned off most of the time a significant saving in terms of energy consumption can be realized.

Second because continuous speech is being transmitted, and only time slots are available for broadcast, it is convenient to represent TDMA signals in digital format. The speech must be encoded into discrete portions to fit in time slots in such a way that continuous speech can be recreated at the receiving end. Because TDMA is digital, further techniques such as digital data compression and various digital coding techniques may be used to minimize transmission errors.

The use of TDMA, however, can bring a new set of constraints. One of these constraints involve the requirement of transmitter control for limiting transmissions to the allotted time slots only. This type of transmission, often called burst or pulse transmission mode, involves turning on the RF power amplifier just after the beginning of a time slot allotted to the radiotelephone unit, increasing the power to a predetermined level, transmitting the encoded signals during the time slot, decreasing the power, and finally shutting off the RF power amplifier near the end of the time slot. One of the problems inherent in such a mode of transmission is the possibility of spurious RF radiation that can be created if the RF power amplifier, or any solid state device, is turned on or shut off too quickly, or in a non linear fashion.

A second problem is the tendency for a pulsed radio to disturb neighboring frequency channels, a phenomenon often called AM splash. AM splash generally occurs when a power amplifier ramps up too fast causing energy to appear outside the allotted transmission bandwidth.

A third problem can occur when an RF power amplifier does not turn off prior to the end of the allotted time slot thereby disturbing the transmission on the succeeding time slot. All these problems are heightened by the fact that a pulsed transmission system turns on and off many times per second and so any interference generated tends to happen repeatedly and continuously during the time the interfering system is activated.

To combat these problems standards have been developed regarding burst mode radiotelephone transmission. On of the most popular standards is the Global System for Mobile Communications (GSM) format. The GSM format is the basis for the European Personal Communications Standard (PCS) and has also found wide acceptance in North America as the PCS-1900 standard. In order to insure that the aforementioned problems are minimized the GSM format includes a power versus time templates that specify power limits for broadcasting in a burst mode in such a way as to minimize unwanted interference. This template specifies the desired power output level ranges versus time for a TDMA time slot. The GSM power template dictates a maximum and minimum power level for each point on the curve. It is desirable to limit the power output to values inside the GSM power template, to control the desired level for transmission. It is also desirable to have a smooth turn on and turn off of the RF amplifier, to minimize the possibility of spurious RF generation. Many radiotelephone systems implement the GSM standard by controlling the RF power amplifier in such a manner that it remains within this template.

In an analog control system a comparator compares a desired level of a preset variable, called a setpoint or reference signal, with the value of the variable the control system is attempting to control. The comparator generates an error signal which represents the difference between the desired setpoint, and the actual value of the variable that the control system is attempting to control. This error signal is then used as a control signal to adjust the system to minimize the difference between the setpoint and the actual value of the controlled variable. Generally a setpoint represents the desired value of a variable. A popular method of following the GSM power versus time template is to use an ordinary analog control system and control the setpoint to be a point within the GSM template.

In the case of TDMA radiotelephones utilizing the GSM power template the setpoint represents the desired output power from the RF power amplifier of the radiotelephone. The analog control system receives as its setpoint input a point within the GSM power template. The control system compares the setpoint, with the power output from the radiotelephone's RF power amplifier (the controlled variable) and generates an error signal. This error signal corresponds to the difference between the setpoint and the actual power output of the radiotelephone. This error signal is then used to adjust the RF power amplifier. If the power from the RF power amplifier is too low the error signal will be used to increase the power output from the RF power amplifier, which in turn will reduce the error signal. This process will continue until the RF power amplifier's power output matches the desired value. At that point the error signal will indicate that no further adjustment is necessary. Similarly if the power from the RF power amplifier is too high the error signal will be used to decrease the power output from the RF power amplifier, which in turn will reduce the error signal. This process will continue until the RF power amplifier's power output matches the desired value. At that point the error signal will indicate that no further adjustment is necessary. This method of burst control transmission can, however, present problems as the batteries powering the unit run down. The amount of power that any power amplifier, including RF power amplifiers, can deliver is a function of it's battery voltage and other factors such as temperature. As batteries are diminished, the voltage level provided by the batteries to the amplifier diminish, which at some point can result in diminished amplifier output power. If the amplifier output drops below the setpoint the amplifier control system comparator will provide a control signal to the amplifier attempting to increase the power output of the amplifier as described above. However, because the battery voltage input to the amplifier has diminished, the amplifier may not be able to increase it's output power. Thus when this point is reached increasing the input to the power amplifier or attempting to increase the output of the power amplifier will have no effect. At this point the power amplifier control loop is said to be saturated, in other words it has reached it's maximum.

At or near the saturation point, some of the properties of the power amplifier, such as its ability to reproduce signals accurately, linearly, and without distortion may be reduced. Distortion may cause spurious RF interference to be created, which may interfere with other radiotelephones as well as other circuitry within the radiotelephone. Saturation of the power amplifier may also produce unwanted side effects such as a reduction in efficiency of the amplifier and overheating.

Another issue related to the fact that the power amplifier cannot deliver as much power as the control circuitry setpoint demands is the loss of control of the power amplifier by the control circuitry. If the control circuitry detects that the power output of the power amplifier is less than the desired setpoint, an error signal will be created. This error signal will result in an attempt to increase the output of the power amplifier. If the power amplifier is saturated the power will not increase. If the power output does not increase, the error signal will increase as it tries further to correct the difference between the desired and actual power output of the system. Even though the error signal increases the saturated power amplifier can deliver no more power. The error signal will, however, continue to increase as the control system continues, without success, to try to increase the power out of the power amplifier. The control system error signal will be maximized, if the setpoint is not reduced. The consequence is that the error signal will increase from the point at which saturation occurred to its maximum value. Throughout this range ($R_{SAT}$) the changing of the error signal has no effect on the power output. Then when the control system tries to shut the power amplifier off, such as at the end of its burst transmission time slot, it will do so by lowering the desired setpoint. The lowering of the setpoint will lower the error signal, but this will have no effect if the error signal is within the $R_{SAT}$ range. The control system will continue trying to decrease the power amplifier's power output but this will have no effect until the error signal has decreased below the lower end of the $R_{SAT}$ range. When the error signal finally does get below the $R_{SAT}$ range the power amplifier may be out of the desired power template and significantly off the setpoint. This discrepancy between the desired power setpoint and the actual power may increase the speed at which the power amplifier shuts off. This in turn may cause spurious RF radiation if the turn off function is too sudden. In addition because the power may not be decreasing according to the GSM power template recommendations, the actual output power before the amplifier is turned off may run over into the adjacent time slot, thereby interfering with a transmission occurring in that succeeding time slot. In addition this less than ideal turn off may cause excess power to be dissipated and result in the generation of excess heat. These problems are increased by the fact that, because the burst transmission mode is repetitive, these turnoffs occur over and over several times per second and any spurious RF radiation is repeatedly generated, and excess heat generation will tend to accumulate.

SUMMARY OF THE DISCLOSURE

Accordingly, preferred embodiments of the present invention relate to communication systems and process and components thereof which address the above noted problems associated with TDMA transmissions within desired power profiles.

According to one embodiment of the present invention a transmitter has an amplifier, an amplifier controller, and a digital signal processor wherein the controller has a comparator with a reference input controlled by two inputs. The first input is generated by a digital signal processor, and the second input is generated by a power output sensor connected to the output of the amplifier. A current sensor is provided for determining the current flowing to the amplifier from the amplifier's power source. The output of this sensor is also connected to the digital signal processor. The digital signal processor detects the current flowing to the amplifier. In one embodiment of the invention the digital signal processor compares the amount of current flowing to a known safe value and by cutting back the setpoint of the power amplifier whenever the current increases beyond the known safe value prevents the saturation of the power amplifier.

In another embodiment of the invention the digital signal processor compares the change in the power amplifier's setpoint to the change in the current drawn by the power amplifier, and by detecting a proportionally diminishing current drawn by the amplifier detects the onset of saturation of the amplifier control system. When the saturation point is detected in this manner the digital signal processor can prevent saturation by limiting the setpoint of the power amplifier to values which are less than the value at which point the saturation is detected.

DETAILED DESCRIPTION OF PREFERRED EMBODIMENTS

Embodiments of the present invention relate generally to communications systems and processes which employ radio frequency (RF) amplifiers.

RF amplifiers according to the embodiments of the present invention may be employed in a variety of wireless communications electronics as well as non communications where RF energy is controlled. Thus, embodiments of the invention described herein may involve various types of systems. However for the purposes of simplifying the present disclosure, preferred embodiments of the present invention are described herein in relation to personal wireless communications systems, including, but not limited to mobile telephones, cordless telephones and the like. Such personal communications systems typically include one or more portable or remotely located receiver and transmitter units which are powered by batteries. In most applications it is desirable to minimize the power requirements, size, weight and cost of such receiver/transmitter units, for example to improve portability and increase the usage time between power recharges. In most applications it is also desirable to minimize the interference with other devices in order to efficiently use the radio spectrum allotted to that particular class of device.

Figure 1:
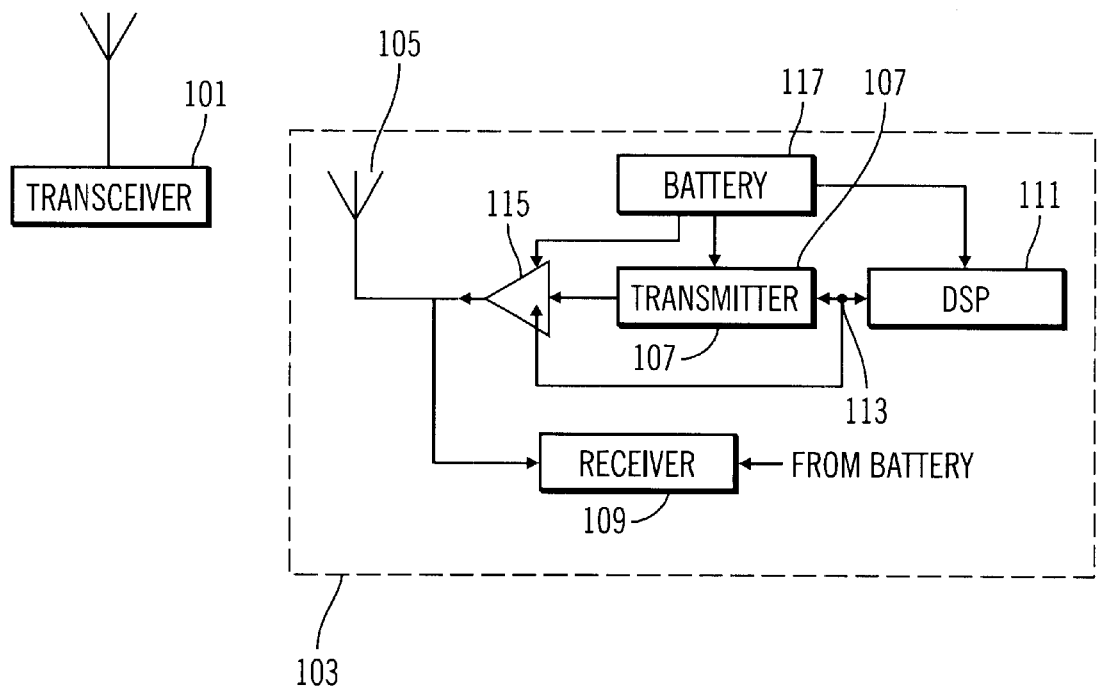
FIG. 1 is a block diagram of a system and environment according to an example embodiment of the present invention.

A generalized representation of a communication system environment of an embodiment of the present invention is shown in FIG. 1. This particular embodiment includes a fixed site transceiver 101 which sends out RF signals to mobile and portable radiotelephone units within a geographic area. One such portable radiotelephone unit is shown at 103. The radiotelephone unit includes an antenna 105. The antenna is attached to a receiver 109 for receiving RF signals and to a power amplifier 115 for amplifying RF signals from a transmitter 107, to broadcast RF signals. The transmitter 107 and power amplifier 115 are controlled via signal lines from the digital signal processor (DSP) 111. The portable radiotelephone unit 103 also includes a battery 117 for powering all the electronics within the radiotelephone unit.

Figure 2:
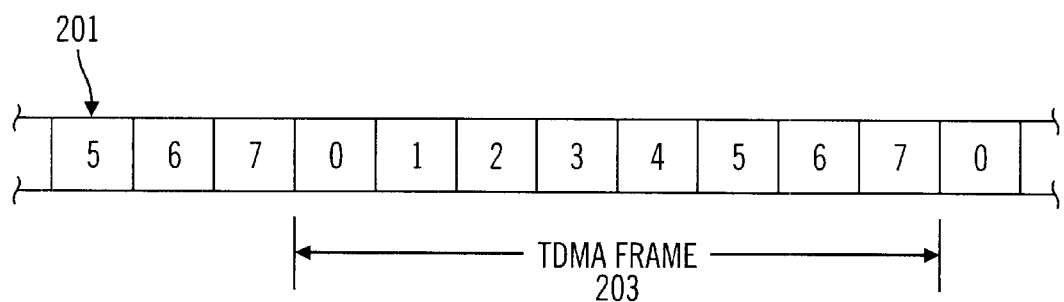
FIG. 2 is a representation of a TDMA (Time Domain Multiple Access) frame which may be employed in an embodiment of the invention.

In one of the embodiments of this invention the radiotelephone unit 103 uses a Time Domain Multiple Access (TDMA) protocol for broadcasting. An example representative of a TDMA protocol is illustrated in FIG. 2 as a succession of discrete time slots, wherein several radiotelephone units share the same radio frequency by limiting the time that each radiotelephone unit may broadcast. The time that any one unit may broadcast is represented in FIG. 2 as a TDMA time slot 201. In the example embodiment of the TDMA protocol, eight such radiotelephone units share the same broadcast frequency and, thus, the TDMA frame 203 then contains eight TDMA time slots 201. Each radiotelephone unit broadcasts only during its associated TDMA time slot. This is typically accomplished by turning on the power amplifier 115 of a RF unit only during the unit's associated time slot and turning it off during other portions of the time frame 203. Because the power amplifier of each RF unit is only on part of the time frame power is conserved.

Figure 3:
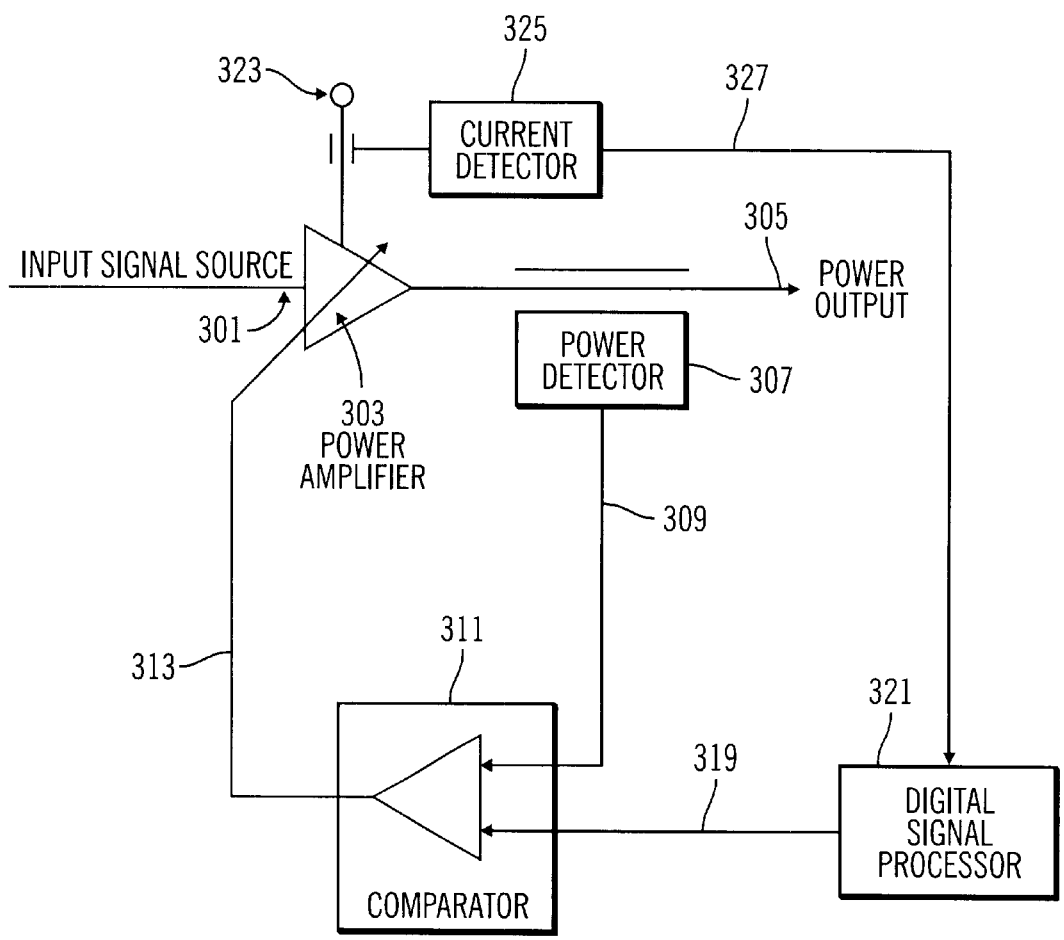
FIG. 3 is a block diagram of a power amplifier and associated control circuitry according to an embodiment of the present invention.

FIG. 3 is a block diagram of the power amplifier and associated circuitry which may employ the TDMA protocol and power amplifier control according to an embodiment of the present invention. The RF input signal to be broadcast 301 is provided to the power amplifier 303. The power amplifier is controlled by the power amplifier control signal 313. This control signal controls the gain of the power amplifier between a value of zero, i.e. effectively off, to a maximum power value according to well known controllable power amplifier principles. In a typical method for controlling the power amplifier, the RF output 305 of the power amplifier is measured by a power detector 307. The power detector 307 produces a power measurement signal 309 which is proportion to the RF output of the power amplifier 303. The power measurement signal is fed to a comparator 311 which compares the power measurement signal representing the actual amplifier output power to a reference signal, 319, supplied by a digital signal processor 321. The digital signal processor 321 supplies the digital reference signal, for example from a stored profile representing desired turn on function and turn off function characteristics which correspond to broadcasting during a TDMA time slot. The digital signal processor also receives a current measurement signal 327 from a power amplifier power supply current detector 325, which measures the current being drawn by the power amplifier 303 from the power amplifier power supply 323.

Figure 4:
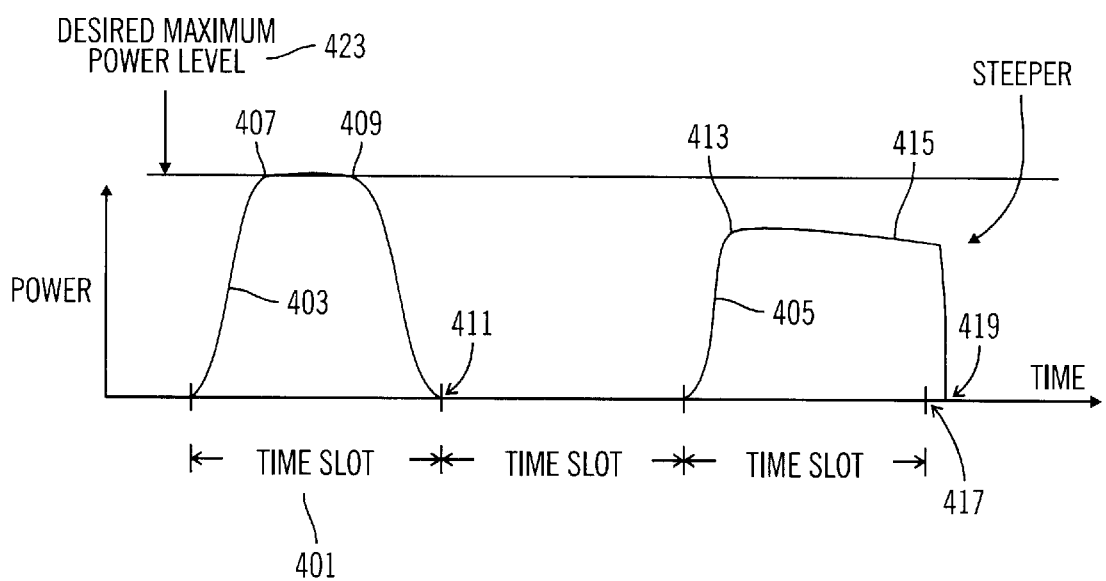
FIG. 4 is a set of power curves for a radiotelephone using a TDMA protocol, which may be used with an embodiment of the present invention.
Figure 5:
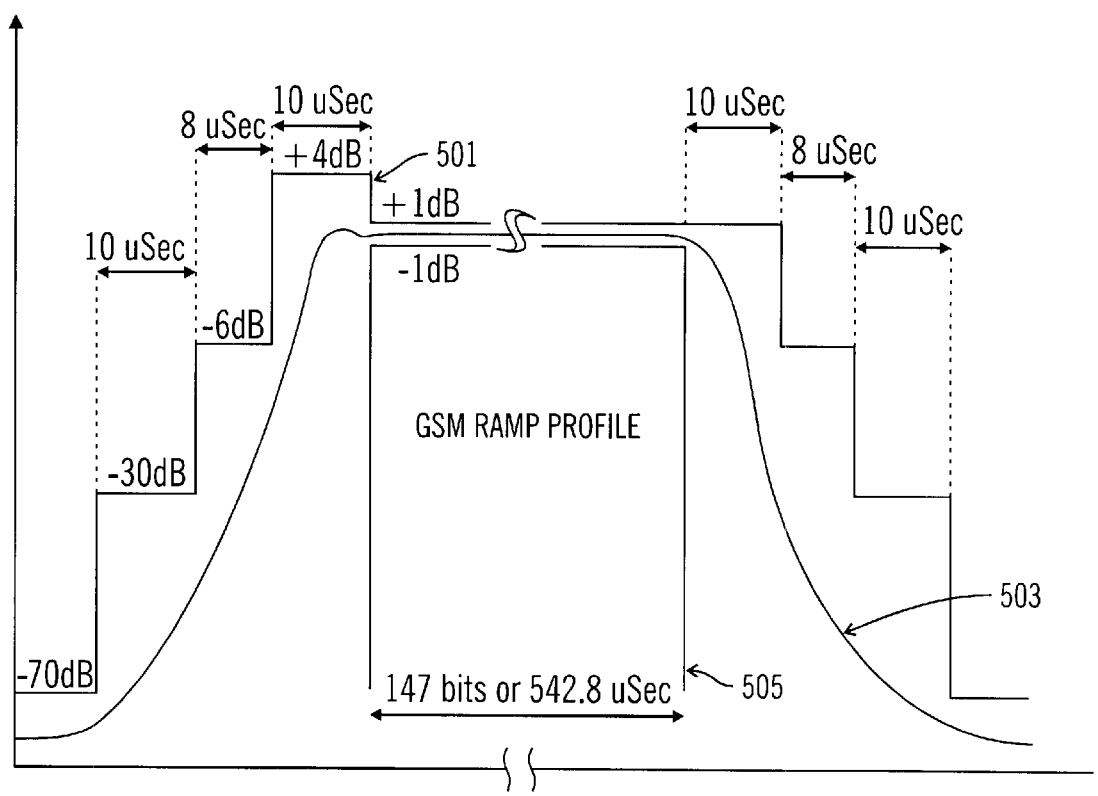
FIG. 5 is an example GSM power template for a radiotelephone using a TDMA protocol, and an embodiment of an example power curve.

FIG. 4 shows example representations of power curves for a radiotelephone using a TDMA protocol representing the output power level of an amplifier during its corresponding time slot 201. In a preferred embodiment of the invention the power curves may be developed by reference to the GSM power template curve. The GSM power template curves are an industry standard protocol representing recommended boundary power levels for radiotelephones using a TDMA protocol. The GSM power template is shown in FIG. 5, along with an embodiment of a TDMA power profile within that curve. An embodiment of the present invention may be used with radiotelephones using the TDMA protocol. In the TDMA protocol an individual radiotelephone is assigned a TDMA time slot, 401, during which it may broadcast. As noted above, by limiting the time a radiotelephone can broadcast two benefits are gained. First power is conserved over the situation where a radiotelephone is allowed to broadcast continuously, and secondly interference with other radiotelephone units is minimized, because they are not broadcasting at the same time.

The desired power curve 403 represents an embodiment of the power profile of the output of an amplifier during its corresponding time slot. The power output of the power amplifier is increased during the TDMA time slot until maximum power, 407, it reaches the desired maximum power level 423. Then, after the radiotelephone unit has sent its data in the time slot, the power begins to decrease, 409, until the RF power output reaches zero 411 before the end of the time slot.

The desired power curve 403 is also represented in FIG. 5 as an embodiment of an example power curve 503. The example power curve is designed to fit between the illustrated maximum power of the example GSM power template shown 501, and the minumum power level of the example GSM power template shown 505.

As the battery which powers the power amplifier discharges the power amplifier may no longer be able to reach the desired maximum power level 423. An example of this situation, often referred to as control loop saturation, is illustrated by power curve 405. In that case the amplifier output power increases to a point 413 where the maximum power output is less than the desired power level. At that point the system power detector 307 provide a power measurement signal 309 representing a power level lower than the desired power level represented by the reference signal 319. If these signals are provided to the comparator a control signal 313 would be provided for controlling the power amplifier to increase the output power. However, if the battery is low, no more power may be available, and the power output of the amplifier will not increase, yet the detector 307 will continue to provide a low power measurement signal 309 and a control signal 313 will continue to control the amplifier to try to increase its power output, resulting in a condition commonly referred to as saturation of the power amplifier control loop. This will continue until the power amplifier control signal reaches its maximum value. This condition will continue until the digital signal processor 321 reduces its reference signal 319 below the power measurement signal 309 and the control loop starts reduction of power, 415.

Because the control loop and amplifier are in a condition of saturation the reduction of the reference signal 319 by the control system will have less of an immediate effect than if the system were not saturated. This can result in the power turn off lagging behind the desired power turn off. This lag may have several undesired effects. This lag may cause a large discrepancy between the desired output and the actual output. This will result in a large error signal being generated at the comparator. When the system does finally pull out of saturation this large error signal can cause a rapid turnoff of the RF amplifier. Such a rapid turnoff can cause spurious RF signals to be generated. These signals may interfere with the operation of other electronic equipment and the radiotelephone unit itself. Another ill effect can result from the power turn off lagging the desired power turn off and is shown in FIG. 4 on curve 405. The power turn off may lag the desired power turn off to such a degree that the point where the power output reaches zero, 419, may occur after the end of the TDMA time slot 417. In such a case transmission on the succeeding TDMA time slot will be interfered with.

These effects become more pronounced as the battery voltage within the unit drops. This is because power is a product of voltage times current, and so to maintain a constant power output as the battery voltages drops, a proportionately larger current must be drawn. Because a larger current must be drawn by the power amplifier as the battery voltage depletes, we can monitor the current being drawn by the power amplifier as an indicator of how low the voltage is and how much power is being generated.

For any given voltage the current drawn by the power amplifier can be monitored to ascertain whether the amplifier is nearing saturation or not. This is because, if the battery voltage is held constant, an increase in current reflects in a proportional increase in power. Also for any given power, if the battery voltage is increased the current drawn will decrease proportionately.

However, according to an embodiment of the present invention, the current drawn by the power amplifier is monitored by a current detector 325. In addition the digital signal processor 321 is programmed to define a reference signal which causes the power amplifier to draw up to a predefined current threshold, $I_{SAFE}$, to avoid saturation of the amplifier control loop. As the battery voltage depletes, the current required by the power amplifier to produce a given power level increases in an amount defined by the equation Power=Voltage×Current. In order to keep the control system out of saturation, the digital signal processor 321 monitors the current drawn by the power amplifier 303. Upon the current reaching the $I_{SAFE}$ value the digital signal processor 321 is controlled to limit the digital reference signal 319 to the value, as a maximum, which produced the corresponding $I_{SAFE}$. The digital signal processor 321 must not increase the digital reference signal beyond the value that produced the corresponding $I_{SAFE}$. If the digital signal processor 321 limits the digital reference signal in this manner the amount of power output will be less than desired, but the control loop will be kept out of saturation.

In one embodiment the value of $I_{SAFE}$ is determined as a part of an initialization or a calibration process, for example, at the time of manufacture. The value of $I_{SAFE}$ will vary for each radiotelephone unit, and so each radiotelephone unit, in this particular embodiment, will store a value for $I_{SAFE}$ in a non volatile memory within each radiotelephone unit.

To determine the value $I_{SAFE}$ for a radiotelephone unit, according to one embodiment, first a determination of the low battery voltage will be the minimum, $V_{MIN}$ at which the radiotelephone unit will be allowed to operate is made. This determination may be made depending on the type of battery being use, the voltages at which the other electronic components within the radiotelephone can tolerate, and a variety of other factors. When this value is determined the radiotelephone unit will be connected to a power supply providing a voltage signal of this value at the time of manufacture in order to measure a value for $I_{SAFE}$. With the lowest acceptable battery voltage $V_{MIN}$, determined, $I_{SAFE}$ can then be determined.

For example $I_{SAFE}$ may be determined in a variety of ways. One way is to simply increase the power amplifier control signal 313 to the power amplifier 303, until an increase in the power amplifier control signal 313 no longer produces an increase in the output of the power amplifier 303, i.e. begins to enter saturation. The current is then read and $I_{SAFE}$ is set to a value somewhat less than then the value read to provide a suitable margin of safety.

Another way to determine $I_{SAFE}$ is to set the power supply to $V_{MIN}$, and then to set the power amplifier control signal to a point that produces a power output that is acceptable from a standpoint of quality and magnitude and measure the current at that point. And use it to determine $I_{SAFE}$.

When $I_{SAFE}$ has been determined for each unit it may be then recorded within the unit by storing the value in a non volatile memory, burning it to a EPROM, causing it to be written into an EEROM, or a variety of other methods well known in the art.

Another embodiment of the invention can be used when the actual battery voltage is known. If this is the case then a series of measurements can be taken of various battery voltages, each radiotelephone unit can then be programmed with a series of values for $I_{SAFE}$, each value corresponding to an $I_{SAFE}$ for that particular battery voltage. In this way saturation of the amplifier can be prevented even at higher than minimum battery levels. This method could be preferred where saturation may occur at higher than minimum battery voltage brought on by such condition as extremes in operating temperatures.

In a further embodiment of the invention the current consumed by the power amplifier is dynamically monitored. In this embodiment the battery voltage during any particular time slot may be considered to be relatively constant, given that time slots can be considered a short time period. The power output of the power amplifier is a product of voltage times current. The voltage can be considered to be relatively constant over each time slot and so an increase in the digital reference signal will result in a proportional increase in current detected by the current detector 325 unless the amplifier is saturated or nearing saturation. The digital signal processor 321 may be programmed to expect a certain increase in power that is proportional to the amount that the digital signal processor changes the reference signal. If at any point the digital signal processor 321 increases the digital reference signal 319 and the current detector 325 does not detect an increased amount of current, then the power amplifier control loop has saturated. If the amount of power increased in response to an increase in the reference signal 319 but the amount of increase in current was smaller than expected, then the beginning of saturation has been detected. The digital signal processor 321 is, therefore programmed to avoid increasing the reference signal beyond the point where the control loop begins to saturate, by checking to see that a given increase in reference signal produces the expected amount of increase in the current being drawn by the power amplifier. This method can dynamically detect the entry of the power amplifier into the saturation region. It can also detect the point where saturation of the power amplifier is beginning. Using this method, the digital signal processor 321, can dynamically control how close the power amplifier will be allowed to approach saturation. This embodiment effectively allows the radiotelephone system to keep operating at low battery voltages while avoiding the saturation effects and the resulting spilling over of transmission into adjacent time slots that would otherwise result.

In a typical example of a preferred embodiment of the invention the process would begin with the manufacture of a radiotelephone intended to be used within GSM guidelines for a TDMA protocol.

After determining that the radiotelephone unit is actually functioning the unit is calibrated for the determination of $I_{SAFE}$.

In preferred embodiments $I_{SAFE}$ is determined by first determining the lowest battery voltage at which the radiotelephone unit would be allowed to operate.

Next this lowest voltage is provided to the power input of the amplifier of the radiotelephone unit, thus simulating the lowest battery voltage the radiotelephone unit would operate. The saturation point of the amplifier is then determined by providing control signals to the controllable amplifier increasing the commanded power output reference signal until there is no longer a corresponding increase in the power output, indicating that the amplifier control loop saturation is just being reached. The current being drawn at the power input of the amplifier is then read. Because the lowest voltage will cause the amplifier to draw the highest current for a given power output, if the amplifier current draw does not exceed the amount drawn at the lowest voltage, saturation will not occur. A further derating factor, for example –5% can then be added. Thus the safe current, $I_{SAFE}$, will be calculated as the current being drawn by the power amplifier as amplifier control loop saturation is reached, minus 5% of the of the current being drawn by the power amplifier as amplifier control loop saturation is reached as the derating factor. The derating factor can be tailored to the needs of the application, or omitted entirely.

The value for $I_{SAFE}$ is then written into a non volatile storage area, such as NVRAM, within the radiotelephone unit. The unit can then use $I_{SAFE}$ to monitor the amplifier control loop for saturation.

To monitor the control loop for saturation, the digital signal processor 321 monitors the output 327 of the current detector 325 during a time slot in which the unit is broadcasting. If the digital signal processor detects a current equal to or greater than $I_{SAFE}$, the processor will store the value of the setpoint, 319 ($Set_{MAX}$,) that it is sending to the comparator as a reference signal, at the time that the current equal or greater than $I_{SAFE}$ is detected. This setpoint ($Set_{MAX}$) corresponds to the setpoint representing a maximum power that the power amplifier can safely be commanded to produce, without the amplifier control loop going into saturation. The digital signal processor will compare ($Set_{MAX}$,) to the reference signal every time that it sends a reference signal 319 to the comparator to make sure that the value commanded is less than or equal $Set_{MAX}$. If the reference signal is greater than $Set_{MAX}$, it will be set equal to $Set_{MAX}$ as discussed above $Set_{MAX}$ corresponds to a power level detected at the power detector 307 that is less than the amplifier control loop saturation point. By limiting the digital signal processor's setpoint, 319, to the comparator to $Set_{MAX}$ as a maximum value, the amplifier control loop should never enter saturation.

It may be appreciated by those skilled in the art that although the present embodiments have been described relative to a TDMA radiotelephone system, it is by way of illustration only and that the invention may be applied to other embodiments of mobile communications and to different systems, which employ power amplifiers.

I claim:

1. An apparatus for transmitting signals over a communications channel, the apparatus comprising:

an input signal source;

a power amplifier having a data signal input coupled to the input signal source, a control signal input for receiving a control signal for controlling the power output of the power amplifier, and a power input for receiving a current from a power supply;

an output power detector, coupled to the output of the amplifier, for generating a power measurement signal representing the power output of the amplifier;

a current detector arranged to detect the current received by the power amplifier from the power supply and providing a current measurement signal representative of the current received from the power supply;

a digital signal processor coupled to receive the current measurement signal and provide a reference signal dependant on the current measurement signal;

a comparator, coupled to receive the reference signal and the power measurement signal, for generating an amplifier control signal;

means for coupling the power amplifier output to the communications channel;

a controller for increasing a power output of the amplifier in order to determine a current threshold value that limits the reference signal provided by the digital signal processor; and a storage device for storing the current threshold value.

2. An apparatus as in claim 1 wherein:

the digital signal processor comprises means to prevent saturation of the power amplifier by tracking the changes in the reference signal from the digital signal processor, and comparing the changes in the reference signal from the digital signal processor with the changes in the current measured by the power amplifier current detector, in order to limit the value of the reference signal.

3. An apparatus as in claim 1 wherein:

the digital signal processor comprises means for comparing the value of the current drawn by the power amplifier to a predetermined current value and for controlling the reference signal to a maximum level which produces said predetermined current value.

4. An apparatus as in claim 1 wherein said power amplifier is an RF amplifier contained within a radiotelephone unit.

5. An apparatus for controlling the power level of an output signal from the output of an electronic amplifier, the electronic amplifier having a control signal input for receiving an amplifier control signal and having a power input for receiving current from a power supply, the apparatus comprising:

an amplifier output power detector, coupled to the output of the amplifier, for generating a power measurement signal representing the output power of the amplifier;

a current detector arranged to detect the current received by the amplifier from the power supply and to provide a current measurement signal dependent on the amount of current received from the power supply;

a digital signal processor coupled to receive the current measurement signal and provide a reference signal dependant on the current measurement signal;

a comparator, coupled to receive the reference signal and the power measurement signal, for generating an amplifier control signal;

a controller for increasing a power output of the amplifier in order to determine a current threshold value that limits the reference signal provided by the digital signal processor; and a storage device for storing the current threshold value.

6. An apparatus as in claim 5 wherein:

said digital signal processor comprises means to prevent saturation of the power amplifier by tracking the changes in the reference signal generated by the digital signal processor, and comparing the changes in the reference signal generated by the digital signal processor with the changes in the current drawn by said power amplifier from the power supply, in order to detect and prevent the on set of saturation of the power amplifier.

7. An apparatus as in claim 5 wherein:

the digital signal processor comprises means for comparing the value of the current drawn by the power amplifier from the power supply to a predetermined current value and for controlling the reference signal to a maximum level which produces the predetermined current value.

8. An apparatus as in claim 5 wherein said power amplifier is an RF amplifier contained within a radiotelephone unit.

9. A method for controlling a reference signal for an electronic amplifier, the method comprising:

measuring a current drawn by a power amplifier;

comparing the current measurement to a predetermined current value minus a desired derating factor; and limiting the reference signal depending on the difference between the current measurement signal and the predetermined current value, wherein the predetermined current value is determined by:

providing a power supply to power the power amplifier, the power supply having its voltage output set at a minimum voltage level determined for the operation of the power amplifier;

connecting the power supply to power the power amplifier;

increasing the power output of the power amplifier to a predetermined power level;

measuring an amount of current flowing into the power amplifier; and setting the predetermined current value equal to the amount of current flowing into the power amplifier minus a desired derating factor.

10. A method for controlling a reference signal for an electronic amplifier, the method comprising:

measuring a current drawn by a power amplifier;

comparing the current measurement to a predetermined current value minus a desired derating factor; and limiting the reference signal depending on the difference between the current measurement signal and the predetermined current value, wherein the predetermined current value is determined by:

establishing the power amplifier's maximum power output prior to saturation; increasing the power amplifier's output to the maximum power output prior to saturation;

measuring a current flowing into the power amplifier at the maximum power output point prior to saturation; and setting the predetermined current value equal to the measured current being drawn by the power amplifier at the maximum power output point prior to saturation minus a desired derating factor.

11. A method for controlling a reference signal for an electronic amplifier, the method comprising:

measuring a current drawn by a power amplifier;

comparing the current measurement to a predetermined current value minus a desired derating factor; and limiting the reference signal depending on the difference between the current measurement signal and the predetermined current value, wherein the predetermined current value is determined by:
   establishing the power amplifier's maximum allowable power dissipation;
   increasing the power amplifier's output to a point where the maximum allowable power dissipation occurs;
   measuring a current at the point where the maximum allowable power dissipation occurs; and
   setting the predetermined current value equal to the measured current at the point where the maximum allowable power dissipation occurs minus a desired derating factor.

12. A method for controlling a reference signal for an electronic amplifier, the method comprising:
   measuring a current drawn by a power amplifier;
   comparing the current measurement to a predetermined current value minus a desired derating factor; and
   limiting the reference signal depending on the difference between the current measurement signal and the predetermined current value, wherein the predetermined current value is determined by:
      establishing the power amplifier's minimum allowable linearity;
      increasing the power amplifier's output to a point where the minimum allowable linearity is detected;
      measuring a current flowing into the power amplifier at the point where the minimum allowable linearity is detected; and
      setting the predetermined current value equal to the measured current at the point where minimum allowable linearity is detected minus a desired derating factor.

13. A method for controlling a reference signal for an electronic amplifier, the method comprising:
   measuring a current drawn by a power amplifier;
   comparing the current measurement to a predetermined current value minus a desired derating factor; and
   limiting the reference signal depending on the difference between the current measurement signal and the predetermined current value, wherein the predetermined current value is determined by:
      establishing the power amplifier's maximum allowable distortion;
      increasing the power amplifier's output to a point where the maximum allowable distortion occurs;
      measuring a current flowing into the power amplifier at the point where the maximum allowable distortion occurs; and
      setting the predetermined current value equal to the measured current at the point where the maximum allowable distortion occurs minus a desired derating factor.

14. A method for controlling a reference signal for an electronic amplifier, the method comprising:
   measuring a current drawn by a power amplifier;
   comparing the current measurement to a predetermined current value minus a desired derating factor; and
   limiting the reference signal depending on the difference between the current measurement signal and the predetermined current value, wherein the predetermined current value is determined by:
      establishing the power amplifier's maximum power output;
      increasing the power amplifier's output to the maximum power output;
      measuring a current flowing into the power amplifier at the maximum power output; and
      setting the predetermined current value equal to the amount of current flowing into the power amplifier minus a desired derating factor.

15. A method for controlling a reference signal for an electronic amplifier, the method comprising:
   determining the difference in reference signals;
   determining the difference in current measurement signals at the corresponding reference signals;
   making a comparison of the change in the reference signals to the change in the current measurement signals;
   setting an allowed range for the comparison of the reference signals to the change in the corresponding current measurement and signals;
   limiting the maximum reference signal based on the allowed range and the results of the comparison.

* * * * *